(12) United States Patent
Legall et al.

(10) Patent No.: US 7,271,591 B1
(45) Date of Patent: Sep. 18, 2007

(54) METHODS AND APPARATUS FOR MRI SHIMS

(75) Inventors: Edwin Lawrence Legall, Menomonee Falls, WI (US); Longzhi Jiang, Florence, SC (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 11/376,506

(22) Filed: Mar. 15, 2006

(51) Int. Cl.
*G01V 3/00* (2006.01)

(52) U.S. Cl. ............... 324/320; 324/309
(58) Field of Classification Search ........ 324/300–322; 600/410–424
See application file for complete search history.

(56) References Cited

U.S. PATENT DOCUMENTS

| | | | |
|---|---|---|---|
| 5,424,643 A | 6/1995 | Morich et al. | 324/318 |
| 5,489,848 A | 2/1996 | Furukawa | 324/318 |
| 5,786,695 A | 7/1998 | Amor et al. | 324/320 |
| 5,893,051 A * | 4/1999 | Tomohiro | 702/130 |
| 6,150,911 A * | 11/2000 | Katznelson et al. | 335/299 |
| 6,194,899 B1* | 2/2001 | Ishihara et al. | 324/315 |
| 6,236,207 B1 | 5/2001 | Arz et al. | 324/318 |
| 6,369,571 B1* | 4/2002 | Damadian et al. | 324/318 |
| 6,653,835 B2* | 11/2003 | Roeckelein et al. | 324/315 |
| 6,774,631 B2 | 8/2004 | Heid | 324/318 |
| 6,853,855 B2* | 2/2005 | Ideler | 600/410 |
| 6,906,517 B1* | 6/2005 | Huang et al. | 324/315 |
| 2003/0025501 A1* | 2/2003 | Ideler | 324/318 |
| 2003/0206018 A1 | 11/2003 | Gebhardt et al. | 324/318 |

* cited by examiner

*Primary Examiner*—Brij Shrivastav
(74) *Attorney, Agent, or Firm*—Fisher Patent Group LLC; Thomas M. Fisher

(57) ABSTRACT

A method includes heating a MRI shim with a heater to reduce a temperature rise per unit of time during a gradient operation of a MRI system.

11 Claims, 4 Drawing Sheets

METHODS AND APPARATUS FOR MRI SHIMS

BACKGROUND OF THE INVENTION

This invention relates generally to methods and apparatus for magnetic resonance imaging (MRI) systems, and more particularly to methods and apparatus that facilitate maintaining a consistent shim temperature.

Typical superconducting magnets may use one or the combination of two independent systems to adjust the magnetic field homogeneity in the imaging volume, in order to meet image quality requirements. The first system is an active system that consists of superconducting correction coils embedded in the superconducting magnet cartridge. The second is a passive system that consists of the placement of carbon steel plates at specified axial and radial location from the magnet isocenter.

Both systems have design capability limitations that are driven by parameters such as: for active systems; maximum current, superconductor type, coils size, coils location and former structural integrity, and for passive systems; steel shim size, steel chemical composition homogeneity, steel shim location, and temperature. For gradient embedded magnet passive shimming system, steels shims are placed inside of the gradient coil in a tray and rail configuration that allows easy shim removal or shim replacement during magnet shimming operation. Heat provided by the gradient coil operation produces temperature fluctuation in the shims during imaging acquisition. For the embedded gradient shim configuration, heat travels from the coil structure to the shim due to conduction contact, by convection only if air is allowed at the shim location, and by radiation. For a magnet inner bore configuration, heat travels from the outside gradient surface to the shim by radiation and conduction thru supporting members if vacuum is present between the components.

Changes to the temperature of the shims causes a change to the magnet field center frequency due to changes in the magnetization properties of the steel with temperature (approximate 0.4%), this is called B0 intensity drift. The actual drift experienced by a magnet during an imaging scan, directly depends on the amount of steel used for the passive shimming, and the amount of heat that the shims are exposed to during gradient operation (shim temperature change). For good image quality, application specialists desire that the magnet drift cause less than a 1 pixel shift during a fifteen minute scan (a typical is 1 Hz/min). In order to achieve good image quality, one desire is that the temperature of the shim must not exceed a certain temperature rise per unit time. Therefore, an additional temperature control system or an active cooling system is typically employed to ensure that the magnet performance is maintained during any operation condition of the gradient coil. The additional cooling typically employed raises costs and adds complexity. Therefore, it would be desirable to maintain the shim's temperature without an expensive cooling system.

BRIEF DESCRIPTION OF THE INVENTION

In one aspect, a method includes heating a MRI shim with a heater to reduce a temperature rise per unit of time during a gradient operation of a MRI system.

In another aspect, a MRI shim system includes a shim and a heater in thermal communication with the shim.

In still another aspect, an imaging apparatus for producing Magnetic Resonance (MR) images of a subject having a magnet assembly for producing a static magnetic field and a gradient coil assembly disposed within the magnet assembly for generating a magnetic field gradient for use in producing MR images is provided. The apparatus includes a MRI shim system configured to maintain a shim within 0.1° C. of the shim's operating temperature.

DETAILED DESCRIPTION OF THE INVENTION

Herein described are methods and apparatus that provide a simple design to control the temperature of the shims during any gradient operational conditions.

As used herein, an element or step recited in the singular and proceeded with the word "a" or "an" should be understood as not excluding plural said elements or steps, unless such exclusion is explicitly recited. Furthermore, references to "one embodiment" of the present invention are not intended to be interpreted as excluding the existence of additional embodiments that also incorporate the recited features.

Figure 1:
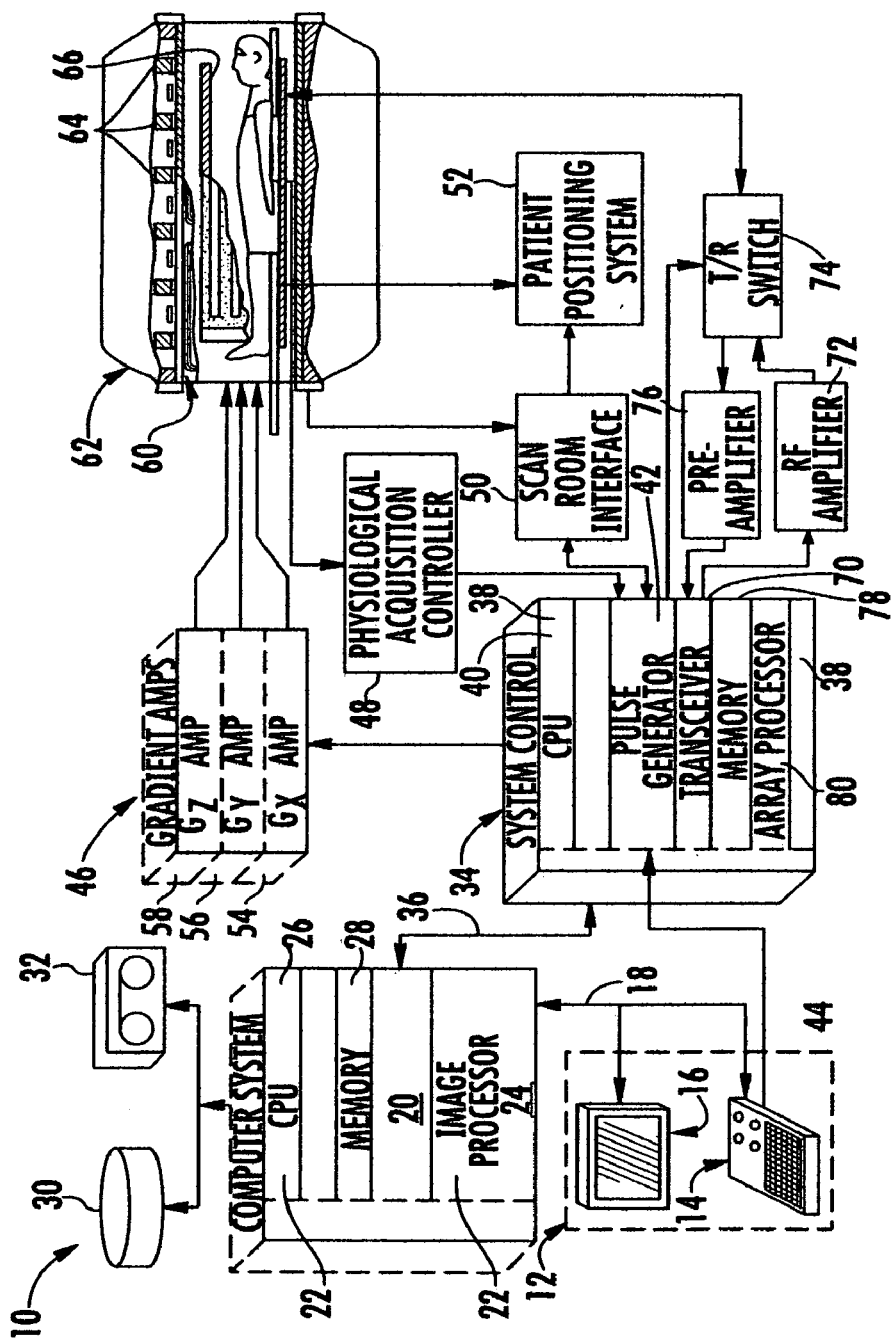
FIG. 1 is a block diagram of an embodiment of a magnetic resonance imaging (MRI) system.

FIG. 1 is a block diagram of an embodiment of a magnetic resonance imaging (MRI) system 10 in which the herein described systems and methods are implemented. MRI 10 includes an operator console 12 that includes a keyboard and control panel 14 and a display 16. Operator console 12 communicates through a link 18 with a separate computer system 20 thereby enabling an operator to control the production and display of images on screen 16. Computer system 20 includes a plurality of modules 22 which communicate with each other through a backplane. In the exemplary embodiment, modules 22 include an image processor module 24, a CPU module 26 and a memory module 28, also referred to herein as a frame buffer for storing image data arrays. Computer system 20 is linked to a disk storage 30 and a tape drive 32 to facilitate storing image data and programs. Computer system 20 communicates with a separate system control 34 through a high speed serial link 36.

System control 34 includes a plurality of modules 38 electrically coupled using a backplane (not shown). In the exemplary embodiment, modules 38 include a CPU module 40 and a pulse generator module 42 that is electrically coupled to operator console 12 using a serial link 44. Link 44 facilitates transmitting and receiving commands between operator console 12 and system command 34 thereby allowing the operator to input a scan sequence that MRI system 10 is to perform. Pulse generator module 42 operates the system components to carry out the desired scan sequence, and generates data which indicative of the timing, strength and shape of the RF pulses which are to be produced, and the timing of and length of a data acquisition window. Pulse generator module 42 is electrically coupled to a gradient amplifier system 46 and provides gradient amplifier system 46 with a signal indicative of the timing and shape of the gradient pulses to be produced during the scan. Pulse generator module 42 is also configured to receive patient data from a physiological acquisition controller 48. In the exemplary embodiment, physiological acquisition controller 48 is configured to receive inputs from a plurality of sensors indicative of a patient's physiological condition such as, but not limited to, ECG signals from electrodes attached to the patient. Pulse generator module 42 is electrically coupled to a scan room interface circuit 50 that is configured to receive signals from various sensors indicative of the patient condition and the magnet system. Scan room interface circuit 50 is also configured to transmit command signals such as, but not limited to, a command signal to move the patient to a desired position with a patient positioning system 52.

The gradient waveforms produced by pulse generator module 42 are input to gradient amplifier system 46 that includes a $G_X$ amplifier 54, a $G_Y$ amplifier 56, and a $G_Z$ amplifier 58. Amplifiers 54, 56, and 58 each excite a corresponding gradient coil in gradient coil assembly 60 to generate a plurality of magnetic field gradients used for position encoding acquired signals. In the exemplary embodiment, gradient coil assembly 60 includes a magnet assembly 62 that includes a polarizing magnet 64 and a whole-body RF coil 66.

In use, a transceiver module 70 positioned in system control 34 generates a plurality of electrical pulses that are amplified by an RF amplifier 72 that is electrically coupled to RF coil 66 using a transmit/receive switch 74. The resulting signals radiated by the excited nuclei in the patient are sensed by RF coil 66 and transmitted to a preamplifier 76 through transmit/receive switch 74. The amplified NMR (nuclear magnetic resonance) signals are then demodulated, filtered, and digitized in a receiver section of transceiver 70. Transmit/receive switch 74 is controlled by a signal from pulse generator module 42 to electrically connect RF amplifier 72 to coil 66 during the transmit mode and to connect preamplifier 76 during the receive mode. Transmit/receive switch 74 also enables a separate RF coil (for example, a surface coil) to be used in either the transmit or receive mode.

The NMR signals received by RF coil 66 are digitized by transceiver module 70 and transferred to a memory module 78 in system control 34. When the scan is completed and an array of raw k-space data has been acquired in the memory module 78, the raw k-space data is rearranged into separate k-space data arrays for each cardiac phase image to be reconstructed, and each of these arrays is input to an array processor 80 configured to Fourier transform the data into an array of image data. This image data is transmitted through serial link 36 to computer system 20 where it is stored in disk memory 30. In response to commands received from operator console 12, this image data may be archived on tape drive 32, or it may be further processed by image processor 24 and transmitted to operator console 12 and presented on display 16.

Figure 2:
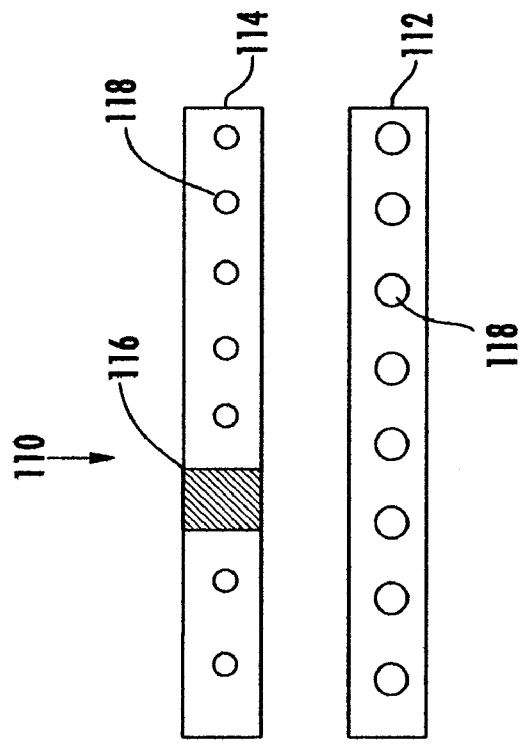
FIG. 2 illustrates an exploded shim system.
Figure 2:
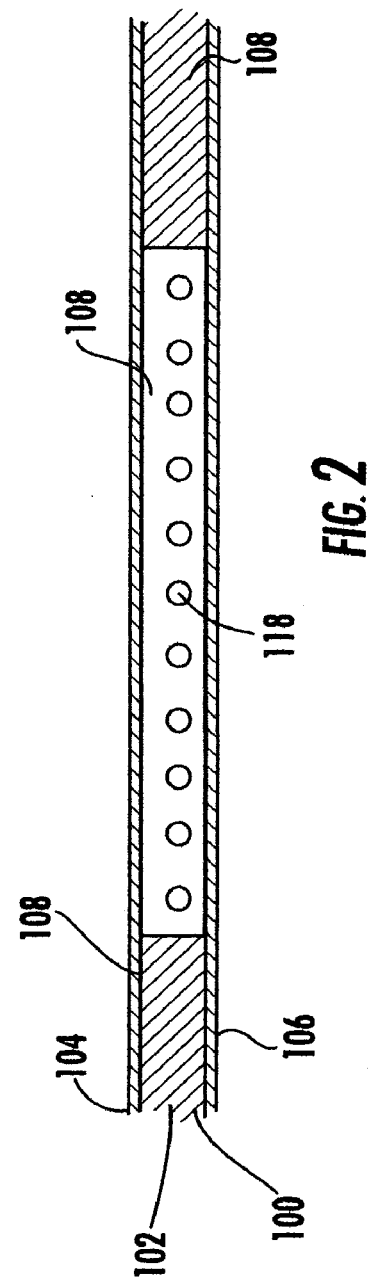

FIG. 2 illustrates a tray 100 with a base or bottom portion 102, and a plurality of side walls 104 and 106 which together form a channel shape. Positioned in the channel are a plurality of shim systems 108. FIG. 2 also shows one shim system 108 exploded at reference 110. Each shim system 108 includes a heater 112, a backing plate 114 and a shim 116. For mounting purposes, a plurality of openings or holes 118 are provided.

Figure 3:
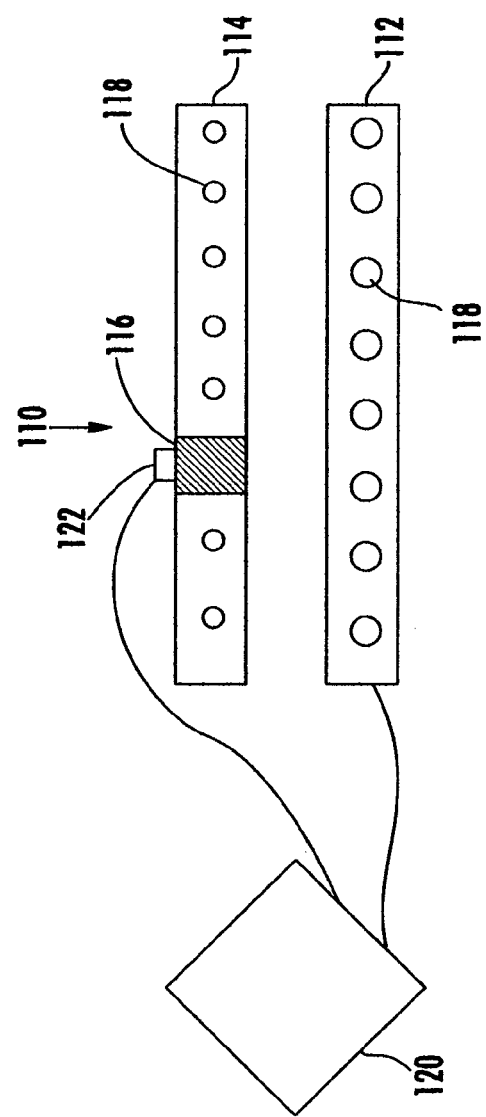
FIG. 3 illustrates a PID control controlling a heater.
Figure 3:
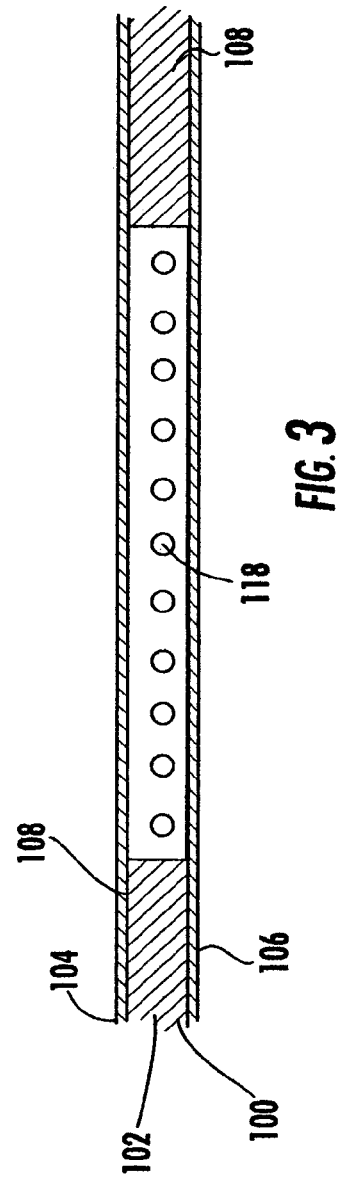

FIG. 3 illustrates a PID (Proportional-Integral-Derivative) control 120 connected to and controlling heater 112. A temperature sensor 122 provides PID 120 with the temperature of shim 116. Tray 100 provides structural support and is manufactured with a non-electrically conductive, non-magnetic and poor heat conductive material (thermal conductivity k≈0.01 to 5 W/mK). Tray 100 is provided with holes 118 to fix steel shims 116 in place and a small recess at the center of the tray to place foil heater 112. In one embodiment, heater 112 is a double electrically insulated foil heater with a power total power of 10 to 15 Watts and approximately 3300 W/m2, and provides enough heating power to raise the temperature of shims 116 to the their operating temperature in approximately 3 to 5 minutes. Metal shims 116 are carbon steel 1010 to 1020 with dimensions of 16×18×1 mm. Backing plate 114 is non electrically conductive, non magnetic, and highly heat conductive material (k≈60 to 100 W/mK plate that is placed above foil heater 112 and isolates shims 116 from foil heater 112 at the tray center location. Temperature sensor 122 is located between heater 112 and backing plate 114 for temperature control. The temperature control provides temperature control of the shim to less than a 0.1° C. variance about the shim's operating temperature.

Figure 4:
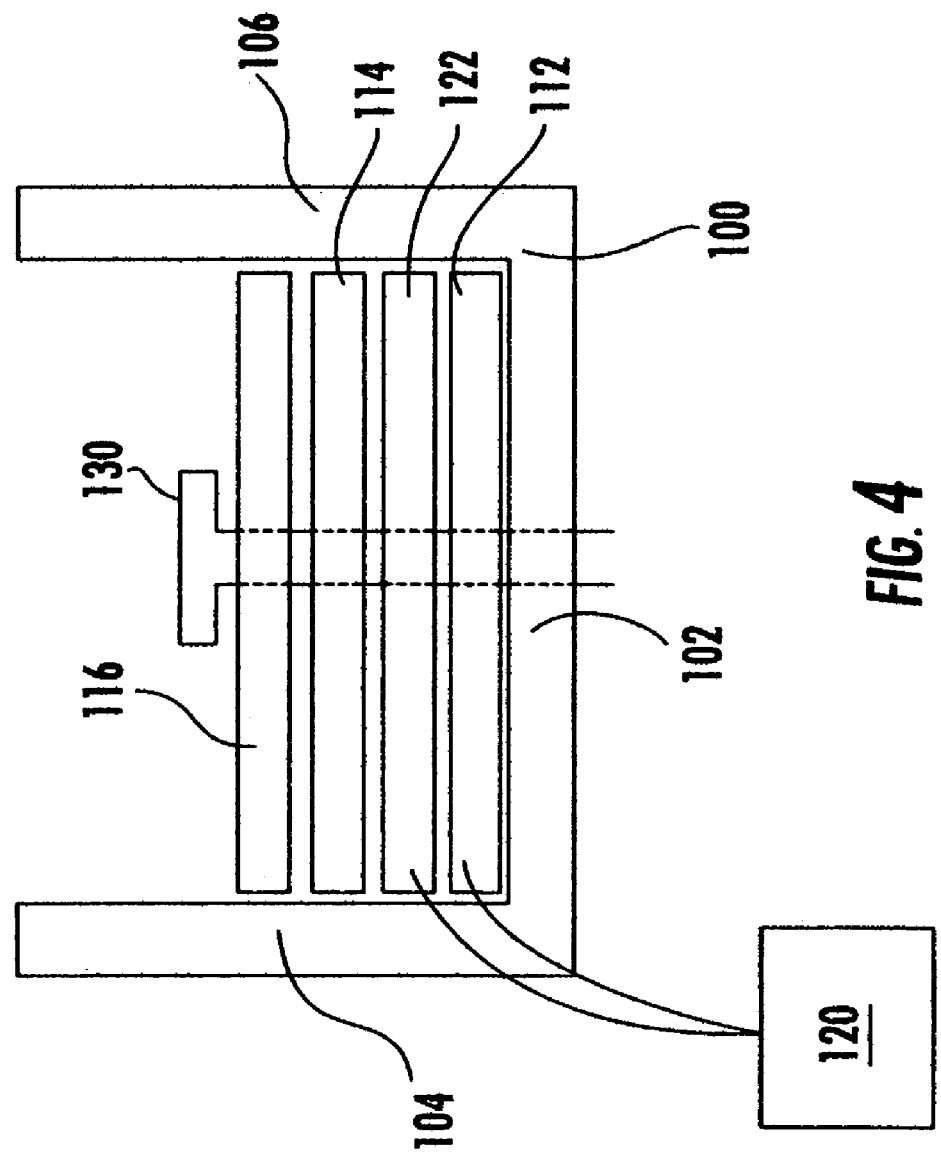
FIG. 4 is a cross-sectional view of the system shown in FIG. 3.

FIG. 4 is a cross-sectional view of the system shown in FIG. 3. FIG. 4 shows that heater 112 is placed directly on tray 100 and then temperature sensor 122 is placed on top of heater 112. However, there could be another element between tray 100 and heater 112. On top of temperature sensor 122 sits the backing plate 114, and then the shim 116 is placed last on top. Although shown in FIG. 4 with the sidewalls 104 and 106 extending much past shim 116, other embodiments place the side wall even with or below shim 116. FIG. 4 also illustrates a bolt 130 that attaches all components to tray 100. However, other fasteners may be used.

The system is applicable to both embedded gradient passive shim and inner bore magnet configuration that may require additional passive shim temperature control to avoid B0 intensity drift. The system works in maintaining the temperature of the shims at a constant elevated temperature (this temperature is based on the maximum operating gradient coil temperature) using the PID control system. The primary heat necessary to elevate the temperature of the shim and keep them at constant temperature is provided by the foil heater attached to the high thermal conductive plate that provides an isothermal surface for the shims with reduced temperature fluctuations, driven by secondary heat source (heat provided by the gradient coil) and the performance of the temperature control unit. The system is designed so shims reach steady operation temperature in three to five minutes with peak power consumption at the starting condition. During gradient operation the time constant of the temperature rise at the pocket location is small compared to the time constant of temperature rise of the shim due to the heat provided by the foil heater, allowing good conditions for a PID temperature control system, in which the temperature of the shim is controlled to be within 0.1° C. from the operating temperature. By controlling in real time the temperature of the shims, the temperature rise per unit time is minimized and so is the associated effect on the magnet B0 intensity drift performance during any gradient operating conditions.

Technical effects include that the active system provides uniform temperature of the shims regardless of the gradient coil operating conditions, the system is applicable for both the embedded gradient configuration and the magnet inner bore passive shim system configuration, the system is upgradeable and includes easily replaceable components in case of component failure, and the tray system provides easy shim assembly and shim replacement during magnet shimming operations. Other technical effects include a single or multiple control zone and single or multiple control unit per tray, temperature control units and heater power supplies are the only supporting equipment for the system (no chiller, air flow systems, or any other cooling system are required).

Exemplary embodiments are described above in detail. The assemblies and methods are not limited to the specific embodiments described herein, but rather, components of each assembly and/or method may be utilized independently and separately from other components described herein.

While the invention has been described in terms of various specific embodiments, those skilled in the art will recognize that the invention can be practiced with modification within the spirit and scope of the claims.

What is claimed is:

1. A method comprising:
heating a MRI shim with a heater to reduce a temperature rise per unit of time during a gradient operation of a MRI system, wherein said heating comprises heating a heater below a backing plate that is non-electrically conductive, non-magnetic, a good heat conductor, said heating further comprises heating with a heater under control by a PID control.

2. A method in accordance with claim 1 wherein the backing plate and foil heater both have holes for attaching the MRI shim to the tray.

3. A method in accordance with claim 2 wherein said heating further comprises heating the shim to its operating temperature in no greater than five minutes.

4. A method in accordance with claim 3 wherein after the shim is brought to its operating temperature the PID control maintains the shim within 0.1° C. of the operating temperature with a single or multiple zone control system.

5. A MRI shim system comprising:
a shim;
a heater in thermal communication with said shim; and
a tray positioned on one side of the heater that is non-electrically conductive, non-magnetic, and a poor heat conductor, wherein the shim is on another side of the heater.

6. A system in accordance with claim 5 further comprising a backing plate that is non-electrically conductive, non-magnetic, and a good heat conductor, wherein the backing plate is positioned between said heater and said shim.

7. A system in accordance with claim 5 further comprising a PID control controlling said heater.

8. A system in accordance with claim 5 further comprising a PID control controlling said heater such that said shim is maintained within 0.1° C. of said shim's operating temperature.

9. An imaging apparatus for producing Magnetic Resonance (MR) images of a subject having a magnet assembly for producing a static magnetic field and a gradient coil assembly disposed within said magnet assembly for generating a magnetic field gradient for use in producing MR images, said apparatus comprising:
a MRI shim system configured to maintain a shim within 0.1° C. of said shim's operating temperature, wherein said MRI shim system comprises a heater in thermal communication with said shim and said heater comprises a double electrically isolated film heater.

10. An imaging apparatus in accordance with claim 9, wherein said MRI shim system further comprises a PID control controlling said heater.

11. An imaging apparatus in accordance with claim 9, wherein said double electrically isolated film heater comprises a plurality of shim mounting openings.

* * * * *